United States Patent
Bauer (10) Patent No.: US 10,663,414 B2
(45) Date of Patent: May 26, 2020

(54) METHOD OF PERFORMING ELECTRON DIFFRACTION PATTERN ANALYSIS UPON A SAMPLE

(71) Applicant: Oxford Instruments Nanotechnology Tools Limited, Oxon (GB)

(72) Inventor: Frank Willi Bauer, Udenheim (DE)

(73) Assignee: OXFORD INSTRUMENTS NANOTECHNOLOGY TOOLS LIMITED, Oxon (GB)

( * ) Notice: Subject to any disclaimer, the term of this patent is extended or adjusted under 35 U.S.C. 154(b) by 741 days.

(21) Appl. No.: 15/118,042

(22) PCT Filed: Mar. 10, 2014

(86) PCT No.: PCT/GB2014/050700
§ 371 (c)(1),
(2) Date: Aug. 10, 2016

(87) PCT Pub. No.: WO2015/121603
PCT Pub. Date: Aug. 20, 2015

(65) Prior Publication Data
US 2016/0356729 A1 Dec. 8, 2016

(30) Foreign Application Priority Data
Feb. 11, 2014 (GB) .................. 1402318.8

(51) Int. Cl.
*G01N 23/20058* (2018.01)
*H01J 37/20* (2006.01)
(Continued)

(52) U.S. Cl.
CPC ..... *G01N 23/20058* (2013.01); *G01N 23/203* (2013.01); *G01N 23/20025* (2013.01);
(Continued)

(58) Field of Classification Search
CPC ......... G01N 23/20058; G01N 23/2055; G01N 23/203; G01N 23/20025; H01J 37/20;
(Continued)

(56) References Cited

U.S. PATENT DOCUMENTS 6,326,619 B1 12/2001 Michael et al.
6,835,931 B2 * 12/2004 Wright ................ G01N 23/203
250/307
(Continued)

FOREIGN PATENT DOCUMENTS

EP 2690648 A1 1/2014
WO WO-2013/022917 A2 2/2013

OTHER PUBLICATIONS

Patrick W. Trimby, "Orientation mapping of nanostructured materials using transmission Kikuchi diffraction in the scanning electron microscope," Ultramicroscopy, vol. 120, Published Jun. 15, 2012, pp. 16-24, ISSN 0304-3991, https://doi.org/10.1016/j.ultramic.2012.06.004.*
(Continued)

*Primary Examiner* — Brooke Purinton
(74) *Attorney, Agent, or Firm* — Blank Rome LLP (57) ABSTRACT

A method is provided for performing electron diffraction pattern analysis upon a sample in a vacuum chamber of a microscope. Firstly a sample is isolated from part of a specimen using a focused particle beam. A manipulator end effector is then attached to the sample so as to effect a predetermined orientation between the end effector and the sample. With the sample detached, the manipulator end effector is rotated about a rotation axis to bring the sample into a predetermined geometry with respect to an electron beam and diffraction pattern imaging apparatus so as to enable an electron diffraction pattern to be obtained from the sample while the sample is still fixed to the manipulator end effector. An electron beam is caused to impinge upon the (Continued)

sample attached to the manipulator end effector so as to obtain an electron diffraction pattern.

19 Claims, 9 Drawing Sheets

(51) Int. Cl.
*H01J 37/252* (2006.01)
*H01J 37/295* (2006.01)
*G01N 23/20025* (2018.01)
*G01N 23/203* (2006.01)
*H01J 37/305* (2006.01)
*G01N 23/2055* (2018.01)

(52) U.S. Cl.
CPC ........ *G01N 23/2055* (2013.01); *H01J 37/20* (2013.01); *H01J 37/252* (2013.01); *H01J 37/2955* (2013.01); *H01J 37/3056* (2013.01); *H01J 2237/20207* (2013.01); *H01J 2237/20214* (2013.01); *H01J 2237/20221* (2013.01); *H01J 2237/24578* (2013.01); *H01J 2237/2544* (2013.01); *H01J 2237/31749* (2013.01)

(58) Field of Classification Search
CPC .. H01J 37/3056; H01J 37/2955; H01J 37/252; H01J 2237/20214; H01J 2237/20207; H01J 2237/2544; H01J 2237/24578; H01J 2237/31749; H01J 2237/20221
See application file for complete search history.

(56) References Cited

U.S. PATENT DOCUMENTS

| | | | |
|---|---|---|---|
| 2003/0089852 A1 | 5/2003 | Ochiai et al. | |
| 2006/0284112 A1* | 12/2006 | Tomimatsu | H01J 37/3056 250/492.1 |
| 2013/0037713 A1* | 2/2013 | Hartfield | H01J 37/20 250/307 |

OTHER PUBLICATIONS

R. R. Keller et al., "Transmission EBSD from 10 nm Domains in a Scanning Electron Microscope", Journal of Microscopy, Jul. 11, 2011, pp. 1-7.

R. H. Geiss, et al., "Transmission EBSD in the Scanning Electron Microscope", Microscopy Today, www.microscopy-today.com; May 2013, pp. 16-20.

Dr. H. Schulz, et al., "Improved Gun Shot Residual Analysis—Using FIB and EBSD", Zeiss, Application Note, Jul. 2013, 6 pages.

* cited by examiner

ID OF PERFORMING ELECTRON
METHOD OF PERFORMING ELECTRON DIFFRACTION PATTERN ANALYSIS UPON A SAMPLE

RELATED APPLICATIONS

This application is a national phase of PCT/GB2014/050700, filed on Mar. 10, 2014, which claims the benefit of GB Application No. 1402318.8, filed Feb. 11, 2014. The contents of these applications are hereby incorporated by reference.

FIELD OF THE INVENTION

The present invention provides a method of performing electron diffraction pattern analysis upon a sample. The method is performed in situ within a vacuum chamber of apparatus such as a focussed ion beam scanning electron microscope.

BACKGROUND TO THE INVENTION

In a scanning electron microscope (SEM) a focussed electron beam is rastered over the surface of a specimen. At each point on the raster, an electron detector is used to record the varying signal due to electrons that have been scattered or emitted from the specimen and thus form an image of the rastered field of view. When a small object or feature, such as a particle or an inclusion, is present on the surface of a specimen and this feature is to be analysed, the focussed electron beam is directed on to the feature and X-rays are emitted. An X-ray spectrum can be collected with a suitable detector and used to identify the chemical elements present in the feature. Different types of electron detector can be used to record either the low energy secondary electrons, where the signal is affected strongly by specimen topography, or the high energy scattered electrons, where the signal is affected strongly by the mean atomic number of the material. However, none of these signals provides any information on the crystal structure if the feature happens to contain crystalline material.

Many compounds that have the same chemical composition can have different crystal structures and behave differently (e.g. different forms of $TiO_2$). Furthermore, the crystalline structure can suggest under what conditions (e.g. temperature and pressure) the material was formed which can be useful in forensic investigations. If the feature is crystalline, some electrons and X-rays travelling in very specific directions will be reflected from crystalline planes. Because SEM images are built up in serial fashion by raster scanning of the incident beam, X-ray and electron detectors used in SEMS are typically non-imaging. However, with a suitable camera, typically fitted with a phosphor, it is possible to collect an image of a pattern due to electron or X-ray diffraction (Kikuchi or Kossel) provided the camera has direct line of sight of the feature. The pattern corresponds to the material under the focussed electron beam present at any time.

Figure 1:
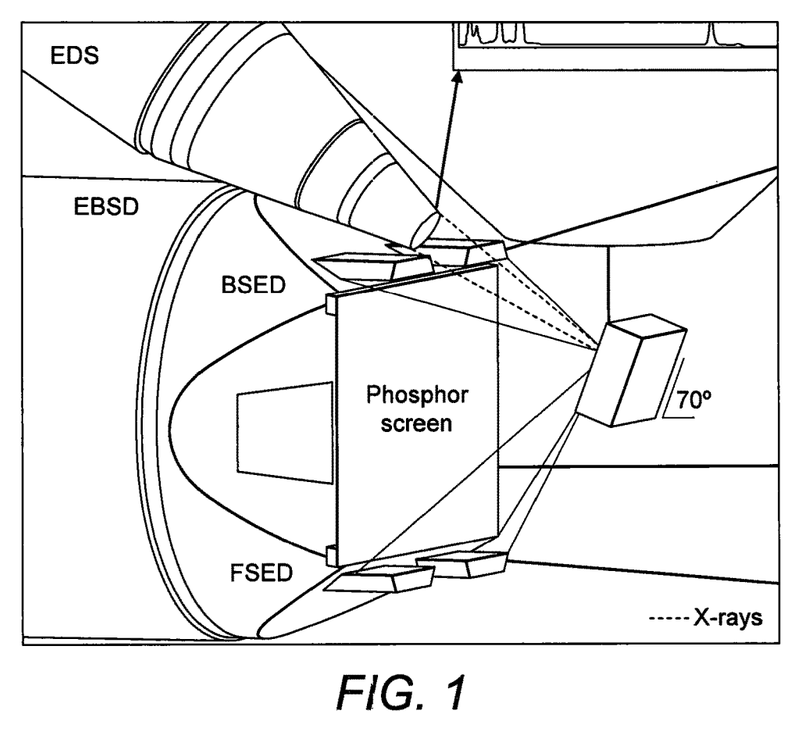
FIG. 1 shows a schematic arrangement of an SEM chamber configured for electron beam diffraction and X-ray analysis.

An electron backscatter diffraction (EBSD) pattern may be obtained using a geometry that is typically as shown in FIG. 1 where the pattern is formed from electrons scattered from just beneath the specimen surface that are Bragg-diffracted by crystalline layers within tens of nanometres of the specimen surface. The high tilt angle of the sample improves pattern contrast. In FIG. 1, EDS is the X-ray detector. EBSD is the camera for collecting an electron diffraction pattern that is formed by electrons striking the phosphor screen. BSED and FSED are solid state electron detectors positioned to detect electrons scattered backwards or forwards (respectively) relative to the point of impact of the incident focussed electron beam which is travelling downwards and striking the sample at an angle of 20 degrees. This angle is commonly taught but other angles can be used.

The accuracy of crystallographic parameters determined by EBSD may not be sufficient to identify a material uniquely and, as explained in U.S. Pat. No. 6,326,619, determination of the chemical elements by X-ray analysis can assist in crystal phase identification. Although the spatial resolution of EBSD is typically better than 100 nm, the X-ray signal is generated over a much larger volume (typically 1000 nm or more for a 20 keV incident electron beam). Consequently, if information is required on features much smaller than 1000 nm, the information from EBSD and X-ray is not complementary because the X-ray spectrum may contain X-rays from elements that are not in the feature but are in nearby peripheral regions.

For EBSD, the contrast of the sharp lines caused by Bragg reflection from crystalline planes against the background of diffusely scattered electrons is improved if the surface has a high tilt with respect to the incident beam. However, this high tilt increases scattering in the direction of tilt and results in spatial resolution that is typically 3 times worse down the tilted surface compared to parallel to the tilt axis. For irregular objects, there can be problems orienting the microscope stage to get a surface of the feature of interest into the line of sight of the X-ray detector, or the camera with a suitable orientation to collect EBSD. If the surface is rough or faceted or has an amorphous superficial layer, it may not be possible to obtain a diffraction pattern. Therefore, it is particularly difficult to obtain EBSD patterns from unprepared irregular specimens such as forensic samples or samples for failure analysis.

Therefore, there is a need for a method to analyse the crystalline structure of a small feature with a spatial resolution much better than 1000 nm and preferably better than 100 nm. This need is particularly strong when analysing irregular specimens. Furthermore, for routine application in forensic or failure analysis, the method needs to be efficient.

SUMMARY OF THE INVENTION

In accordance with the invention we provide a method for performing electron diffraction pattern analysis upon a sample, the method comprising performing the following steps in a vacuum chamber:
  a) isolating part of a specimen using a focussed particle beam so as to form a sample;
  b) attaching a manipulator end effector to the sample so as to effect a predetermined orientation between the end effector and the sample;
  c) rotating the manipulator end effector about a rotation axis to bring the sample into a predetermined geometry with respect to an electron beam and diffraction pattern imaging apparatus so as to enable an electron diffraction pattern to be obtained from the sample while the sample is still fixed to the manipulator end effector; and,
  d) causing said electron beam to impinge upon the sample attached to the manipulator end effector and obtaining said electron diffraction pattern.

We have realised that it is possible to collect a diffraction pattern from a sample held in a specific geometry whilst mounted to an end effector of a manipulator, and without the need to transfer the sample to a specimen stage. Obtaining of a diffraction pattern from a sample whilst mounted to an end effector presents particular challenges regarding the respective orientation needed together with the use of an imaging detector such as a camera. The key enabler of the invention is the combination of a manipulator end effector which has at least the capability to rotate by a controllable angle about a rotation axis, with the use of a predetermined orientation geometry between the manipulator end effector and the sample to be analysed.

The invention is performed within the vacuum chamber of analysis apparatus such as a microscope. Thus, the sample is generated from a larger surrounding specimen, is then mounted to the end effector and then oriented into position with respect to the electron beam, all in situ within the apparatus. This removes the need for transferring the sample to a specimen stage by virtue of the "analysis on tip" approach we describe herein.

At step (a) the sample is isolated from the specimen using a focussed particle beam. This might be an ion beam such as a focussed ion beam (FIB) or a laser. The isolation is effected by removing material from the periphery of a region of specimen which will form the sample. As part of the isolation a connecting region of material may be left between the specimen and the sample to ensure that the sample remains fixed to the specimen at least until the sample has been attached to the end effector of the manipulator. However the provision of such a connection region is not essential since the sample may be completely isolated prior to attachment of the end effector. The isolation step may be controlled so as to shape the sample into a geometry which is suitable for electron diffraction analysis. However, in other cases the isolation step may be simply used to isolate a region of material (which may be thicker than required for electron diffraction analysis and/or irregularly shaped). In this latter case a further procedure may be performed after detachment of the sample so as to form the required geometry of the sample.

Once isolated the end effector is attached to the sample using one of a number of known techniques, for example a gas-based welding technique using a FIB. As an alternative to welding a gripper type end effector may be used to hold a thin lamella for analysis.

Having secured the sample to the end effector, the sample is then detached from the specimen. It should be noted that in some cases the isolation step may leave a connecting bridge of material between the sample and the specimen which is removed to separate the sample after attachment to the manipulator. In other cases the isolation step may totally separate the sample from the specimen before the manipulator is attached. Typically following detachment the sample is moved clear of the specimen, by either movement of the end effector, the specimen, or both. The movement of the specimen stage away from the sample may be preferable because it leaves the sample at the right height for electron imaging and further FIB milling for example.

The invention relies upon the ability of the manipulator to take a sample, mounted in a particular orientation, and reorient it into a position where an electron beam may be used to obtain an electron diffraction pattern. Preferably therefore the manipulator end effector is adapted to be controlled so as to rotate the sample by a known angle about a known rotation axis so as to effect the rotation required. The end effector may take a number of forms including a needle, tip, probe or gripper arrangement. Typically the manipulator is adapted to translate the sample along one or more of X, Y and Z axes. As will be understood, the degrees of freedom and magnitude of each of the rotation and translation capabilities required are dependent upon the arrangement of the apparatus. Translation and rotation of the manipulator end effector are each typically used to bring the sample into the required geometry to collect an electron diffraction pattern while the sample is still fixed to the end effector. Preferably the end effector rotates relative to the remainder of the manipulator.

The focused particle beam operation and the collection of the electron diffraction pattern are performed in situ within the vacuum chamber, this generally being that of a scanning electron microscope. The predetermined orientation relative to the rotation axis is a predetermined orientation in accordance with the geometrical arrangement of the interior of the vacuum chamber. In many cases the vacuum chamber will be that of an FIB-SEM instrument.

In most cases at least part of the sample is formed into a thin slice and wherein at least one surface of said slice has a defined orientation relative to the rotation axis. Typically, when the thin slice has two surfaces, the surfaces are generally parallel and the separation of the surfaces is sufficiently low so as to permit the transmission of an electron beam. In many cases the sample will be formed of a lamella, that is a thin and planar structure having extensive parallel surfaces.

Such small thicknesses may be achieved by a milling process using the particle beam. As has been mentioned, the sample may be formed in such a geometry as part of the isolation step. Alternatively the sample may be thinned to the predetermined thickness required after detachment from the specimen.

The invention may utilise an entirely different geometry to analyse the sample whilst making use of a typical EBSD camera. This sample-beam geometry is exemplified by Geiss et al 2013 Microscopy Today, Volume 21, Issue 03, May 2013, pp. 16-20. See: http://onlinedigeditions.com/publication/
index.php?i=156852&m=&l=&p=20&pre=&ver=swf)

Figure 2:
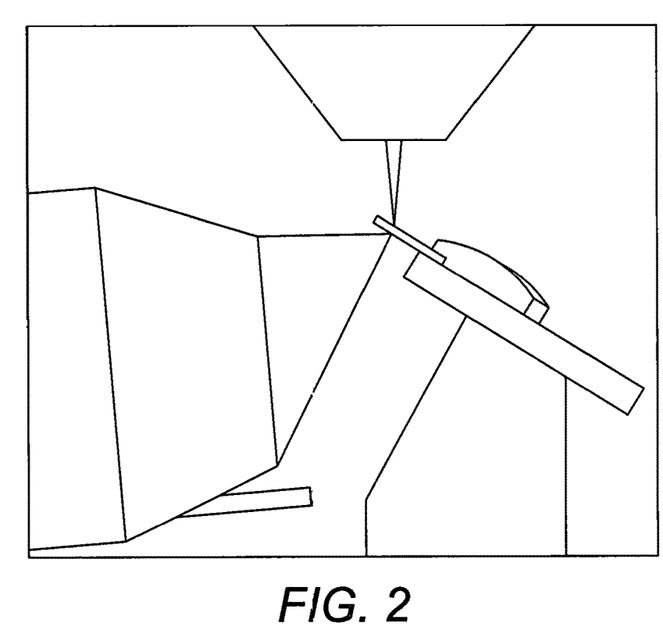
FIG. 2 shows a known arrangement for performing transmission Kikuchi diffraction.

This shows a configuration where the incident electron beam travels through a thin specimen and a camera underneath the specimen acquires a diffraction pattern. This method has been referred to as "t-EBSD" or "transmission Kikuchi diffraction" (TKD) because the pattern is formed from electrons that have been transmitted through a thin specimen and are Bragg-diffracted by crystalline layers very close to the lower surface. In this known method, the specimen is fixed to a sample grid that is supported on a stub on the microscope stage so that the surface is tilted by typically 10 and up to 20 degrees away from normal incidence and the camera views the underside of the specimen. This prior art arrangement according to Geiss et al is shown schematically in FIG. 2 where a clip mounted to the sample stage (right of FIG. 2) is shown holding the supporting grid. This is irradiated with an electron beam (top of FIG. 2) and the electron diffraction pattern is received by the camera (left of FIG. 2). With a thin specimen of the order of 100 nm thickness, the lateral scattering of a 20 keV incident electron beam is considerably less than for a bulk specimen. With such a thin specimen, if an X-ray detector has line of sight of the entry or exit point of the electron beam, the spatial resolution for X-ray information is much better than 100 nm. Furthermore, because the specimen is not tilted at a high angle, the spatial resolution for the diffraction pattern information is better than for EBSD. However, the prior art procedure requires a suitable thin specimen to be prepared elsewhere and mounted over a hole in a sample grid and fixed to a stub before introducing the stub into the vacuum chamber. This procedure is not only time consuming but also runs a risk that the surface of the prepared specimen could be contaminated between preparation and transfer to the vacuum chamber.

These problems are overcome in this invention by the use of the manipulator to hold the sample whilst analysis is performed. This is a key enabler in allowing transmission Kikuchi diffraction patterns to be obtained.

As will be understood, the few known techniques of performing TKD all rely on elaborate mounting of the sample to the specimen stage of a microscope. These are not needed here. In order to obtain the TKD pattern a camera is positioned so as to view the surface of the sample at a location where the incident electron beam emerges after passing through the sample. This view is therefore of the "underside" of the sample whereas the electron beam impinges upon the "topside" in this case. The present invention is also advantageous in that it allows conventional EBSD to be performed, that is using a camera viewing the surface of the sample at a location where the incident electron beam strikes the sample. In this case the "topside" is viewed by the camera. Where a TKD pattern is to be obtained, the thickness of the sample (distance between the surfaces) is 200 nm or less, preferably 100 nm or less.

Although in principle the manipulator could be an internal manipulator mounted for example to the specimen stage of a microscope within the chamber or somewhere on the internal surface of the chamber, it is preferred that the manipulator is inserted into the microscope through an orifice in the vacuum chamber.

Once the electron diffraction pattern has been obtained (of either type) an analysis of the electron diffraction pattern is used to determine crystalline properties of the material. Typically such analysis is computer-implemented. Such analysis may alone provide the information required by a user. However, a further advantage of the use of the end effector to hold the sample is that an X-ray spectrum may be acquired in the same geometry and from a common overlapping region of the sample as was used to collect the electron diffraction pattern. The X-ray detector only has to have a line of site view of the small volume of material excited by the incident beam and with the sample suspended on the end effector there is less likelihood of occlusion by the stage or bulk specimen from which the sample was extracted. If the sample is in the form or a lamella then there will be a good correlation between the region of material which originates the electron diffraction pattern and that which emits the X-rays. The phase of the material in such as region may then be determined using the analysed crystalline properties of the material (from the electron diffraction analysis) in conjunction with chemical elemental information from analysis of the X-ray spectrum.

The method may be extended so as to perform such analyses on multiple locations of the sample. Thus, data may be collected from a series of electron beam positions on the sample to build a linescan or map showing the distribution of different materials over that range of positions.

In practice there may be encountered situations in which either no electron diffraction pattern, or a low quality electron diffraction pattern is achievable initially. In such cases it may be desirable to perform a further polishing or milling procedure using the particle beam. It is therefore advantageous if the rotation and, optionally translation, of the manipulator end effector is used to bring the specimen into the required geometry for particle beam processing and then returned to the required geometry to collect the electron diffraction pattern without detaching the end effector from the specimen. This concept may be further extended such that rotation and, optionally translation, of the manipulator end effector is capable of bringing the specimen into every one of the different geometries required for FIB processing, EBSD and TKD.

BRIEF DESCRIPTION OF THE DRAWINGS

Some examples of methods according to the invention are now described with reference to the accompanying drawings, in which.

DETAILED DESCRIPTION OF EXAMPLES

We now describe example methods effecting a procedure which, while in the vacuum chamber, extracts from the main specimen a small sample that contains the feature of interest and fixes it to the end of a probe that has a controllable rotation about an axis. The probe is arranged to be in a specific orientation with respect to a surface of the sample to be analysed. Thereafter electron diffraction analysis is performed on the sample held by the manipulator. Firstly we describe some practical points associated with the general method.

The initial procedure of isolation of the sample from the larger specimen is preferably achieved by milling using a focussed particle beam that could be a laser beam or a focussed ion beam (FIB). Using the "FIB lift-out" procedure, FIB milling may be used to isolate a small sample of material from the specimen, attach it to a manipulator end effector (probe) and lift it clear of the specimen. In particular, the FIB may be used to mill a trench around the feature of interest to prepare a "lift-out" lamella which is a thin slice of the specimen that contains the feature of interest and is typically less than 200 nm in thickness and has a well-defined orientation. The small lamella may be welded to the manipulator probe tip by injecting a gas into the vicinity and exposing the interface to the FIB beam. In particular, the edge of the lamella may be used to fix the lamella to the probe tip in a particular orientation and this is then lifted clear of the bulk specimen, for example by FIB milling away of a small region of material remaining as the only connection between the isolated sample and the specimen.

The manipulator may preferably be moved in x, y and z directions and has at least one controllable axis of rotation. This enhances the ability of the manipulator to move the lamella, whilst still affixed to the probe tip, into the required position to collect a TKD pattern. If the manipulator tip is likely to vibrate or move, it may be stabilized as described in WO2013022917.

When a TKD pattern is collected using a camera on the opposite side of the specimen to the entry point of the electron beam, then preferably an X-ray spectrum is also acquired so that both TKD and X-ray information is obtained from a small region of the sample around the incident electron beam.

When the pattern is inspected, if the image quality is poor so that it is not possible to deduce the crystalline structure, then the manipulator may be used to translate and rotate the lamella until the axis of the FIB is close to parallel to the surface. Thereafter, with the FIB voltage typically set to a suitable low value, the FIB may be used to remove amorphous material and thereby "polish" the surface without damaging the crystalline structure below. The manipulator may then be used once more to move the lamella back into position to acquire another TKD pattern.

Once the pattern quality is sufficient, crystalline parameters are calculated using measurements from the TKD pattern in the usual manner (see Geiss et al). Preferably element compositional information from X-ray spectral analysis is used in conjunction with the crystalline parameters to achieve unique identification of the phase at the position defined by the incident electron beam.

In a further use case, the focussed electron beam is positioned at a series of points on the sample. A series of TKD patterns, and preferably a series of X-ray spectra are thus obtained on a grid of positions on the lamella and used to generate maps showing the spatial distribution of chemical elements and crystalline phases over a region. If the spatial resolution of these maps is not sufficient to resolve required detail, then the manipulator may be used to move the lamella into a position where the FIB can be used to etch the lamella and make it thinner. The further-thinned lamella is then returned to the analysis position where maps can be acquired with the spatial resolution improved because of the reduction in sideways scattering of the electron beam.

A modification of the method described above involves using FIB lift-out to remove a small sample of the specimen of arbitrary shape attached to a manipulator end effector. The manipulator is then used to move and rotate the sample into a position where FIB milling can be used to form the sample into a thin slice with generally parallel surfaces and a well-defined orientation relative to the rotation axis for the manipulator end effector. Thus in this case the geometry of the sample is produced after lift-out rather than at the isolation stage. The slice is made thin enough to permit transmission of the electron beam. The manipulator can then be translated and rotated into a position suitable to obtain a TKD pattern and perform subsequent operations as described.

A further method involves preparing a thin slice sample by FIB milling, before or after lift-out, such that a chosen surface of the thin slice has a defined orientation relative to the axis of rotation of the manipulator end effector to which it is attached. Through translation and rotation operations of the manipulator end effector, the thin slice is brought into a position where the incident electron beam makes a shallow angle, preferably but not necessarily about 20 degrees, with the chosen surface of the sample and the entry point (not exit point) of the electron beam is visible to a camera. In this position an EBSD pattern is collected (rather than a TKD pattern). In this case the slice sample can be much thicker than would be required for TKD and does not have to have parallel surfaces. Nevertheless, the chosen surface must be suitably crystalline and if the EBSD pattern is poor, the manipulator can be moved and rotated into a position to allow that surface to be polished by a suitable FIB beam to remove surface damage. Subsequent analysis of the diffraction pattern, the option of collection of X-ray data and the potential to map a region on the sample are essentially the same as for the TKD method described.

An example method is now described with reference to the flow diagram of FIG. 16.

Figure 3:
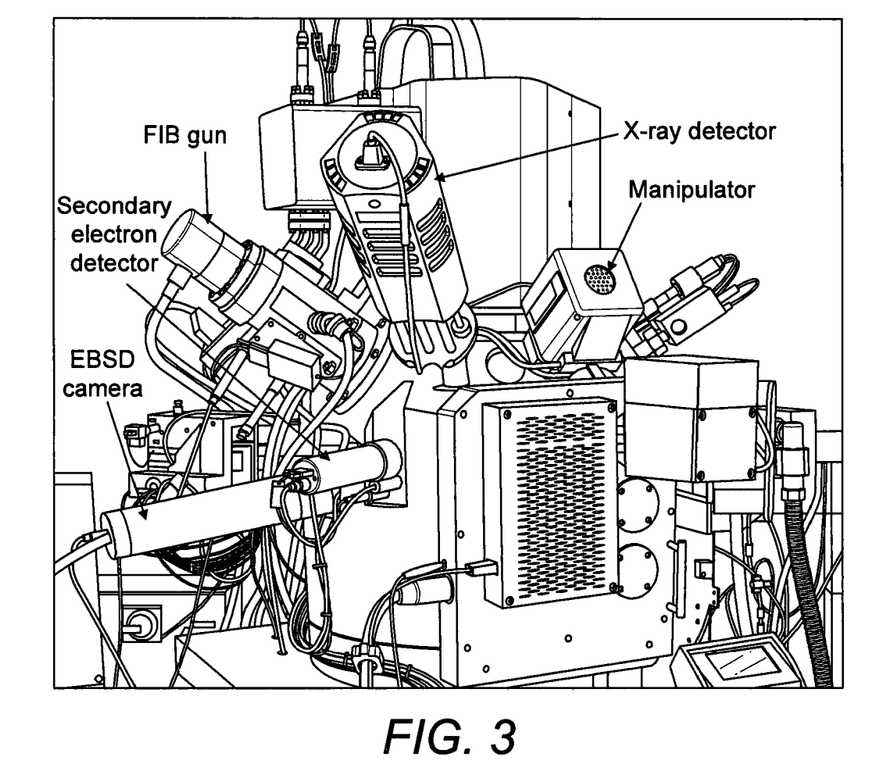
FIG. 3 is an image of a focused ion beam scanning electron microscope with manipulator suitable for performing the invention.

FIG. 3 shows a typical arrangement of focussed beams and detectors in an "FIB-SEM" electron microscope arrangement where an X-ray detector and conventional EBSD camera are mounted on the same side of the chamber. In this arrangement, when the electron beam strikes the specimen, the X-ray detector has line of sight of the entry point and the camera can collect a diffraction pattern.

Figure 4:
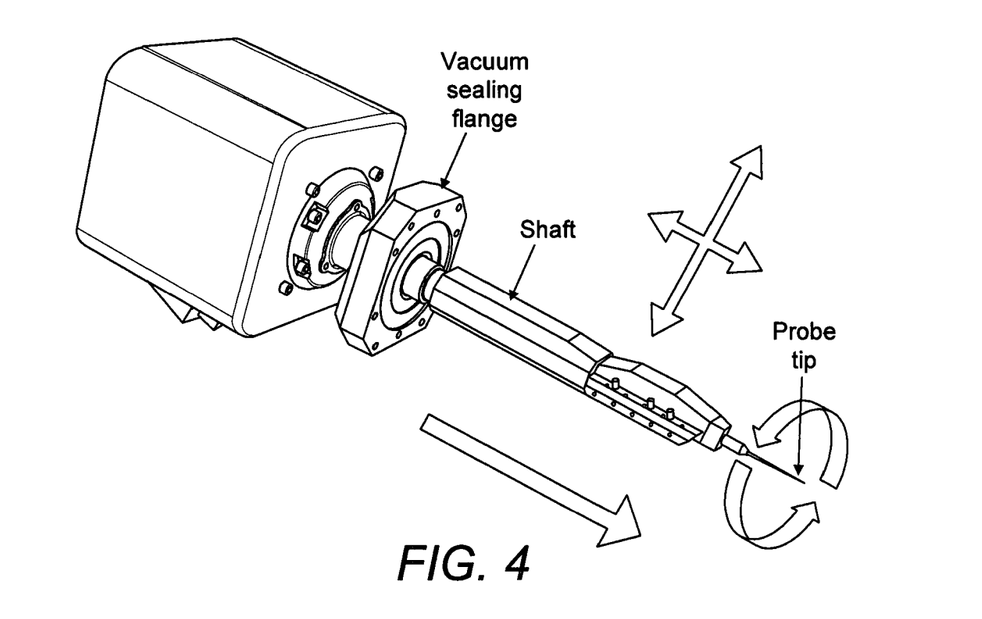
FIG. 4 shows a manipulator with end effector and illustrates rotation and translation operations.

A common manipulator configuration used in an FIB-SEM involves mounting the manipulator through an available microscope port (see the "manipulator" of FIG. 3). In this scenario the manipulator shaft which supports the end-effector or probe extends into the chamber aligned to the beam coincident point. The probe tip can be rotated about an axis and translated in orthogonal directions. FIG. 4 shows an example of such a manipulator with translational and rotational movement capabilities. The vacuum sealing flange is mounted to the available port of the chamber. The shaft of the manipulator extends into the chamber and a probe tip is used to perform operations upon a specimen. For example the Omniprobe 400 manipulator (available from Omniprobe Inc) is advantageous in that it has a probe rotation that is concentric or "concentrically-corrected" so that the axis of rotation is fixed and designed to be collinear with the shaft so that when the tip is rotated, there is minimal displacement in x, y or z directions and the tip stays within the field of view of the microscope and preferably with less than 20 micrometres of movement. This can be particularly advantageous to locate positions for analysis quickly and avoid collision when moving the small specimen in a confined region.

When mounted, the manipulator shaft is typically tilted downwards at an oblique angle relative to the electron column and the axis of rotation of the probe crosses the electron beam axis at an angle which is typically less than 90 degrees. The angle used in the present example is 53 degrees.

Figure 5:
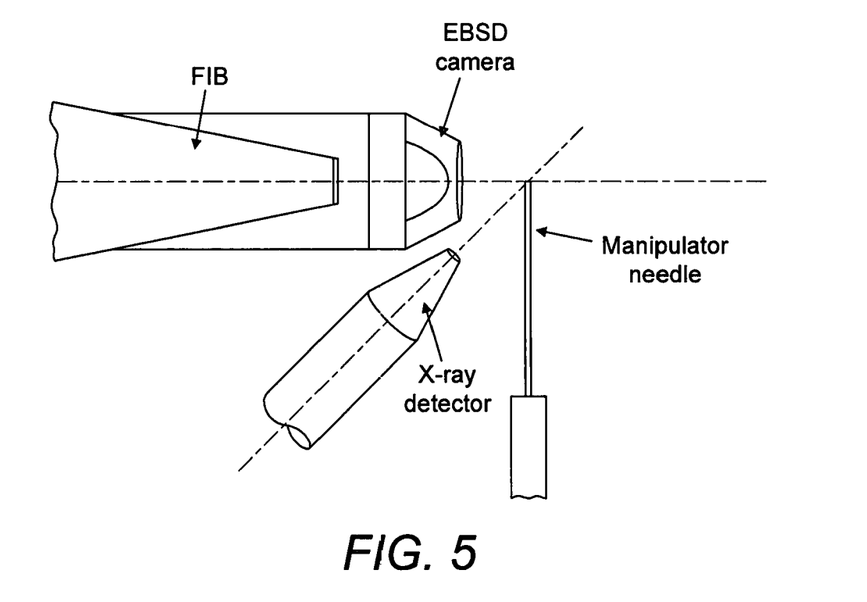
FIG. 5 shows a schematic arrangement of components in a microscope chamber as viewed along the electron beam.

In FIG. 5, a plan view for the same apparatus as in FIG. 3 is shown from the direction of the incident electron beam, that is, looking along the electron beam. The FIB is typically pointing downwards and in this embodiment the ion beam axis makes an angle of 54 degrees with the electron beam direction.

Figure 16:
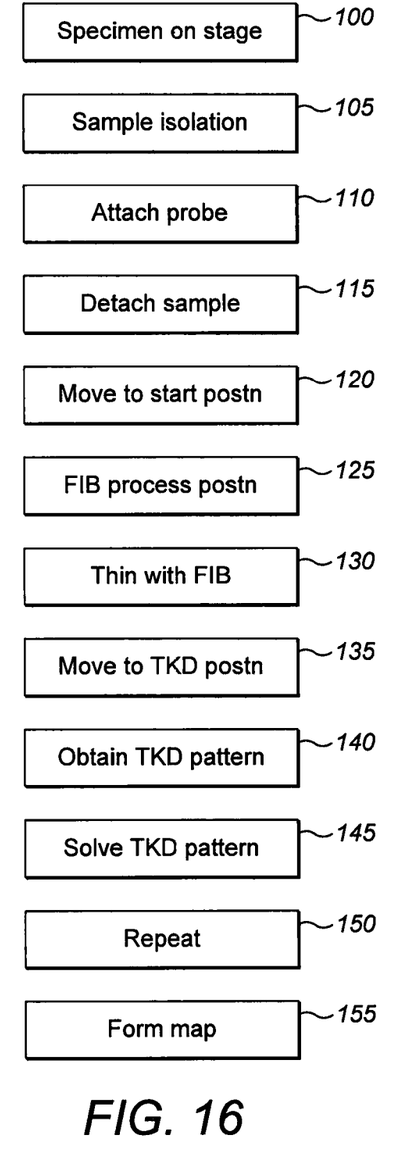

Referring now to FIG. 16, having loaded a bulk specimen to be analysed into the FIB-SEM, at step 100, the bulk specimen is oriented on the microscope stage into a position where the FIB beam can be used to mill the specimen so as to form a desired geometry.

Figure 6:
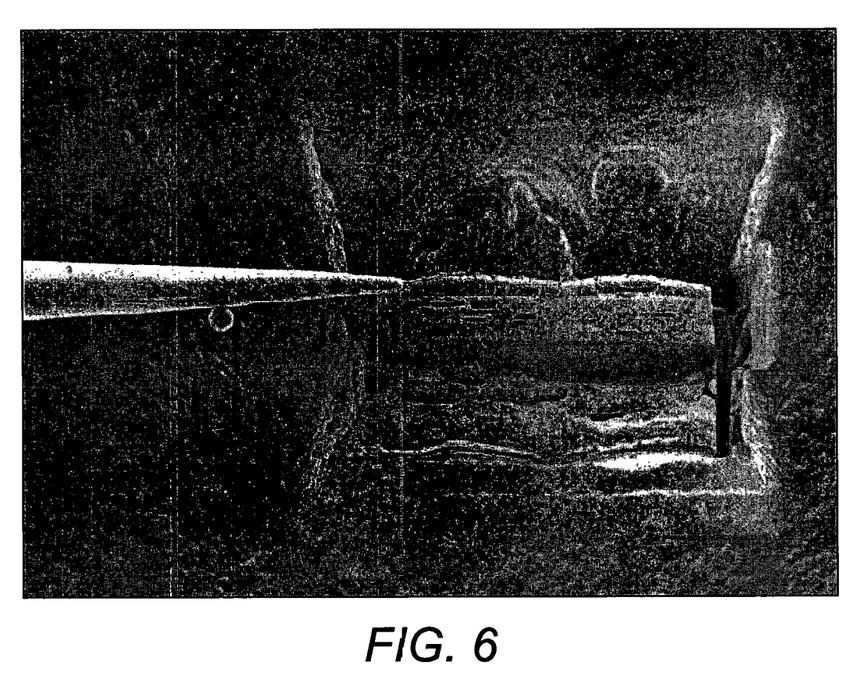
FIG. 6 shows the isolation of a sample lamella using a focussed particle beam.

At step 105 the FIB is operated so as to mill a trench around a part of the specimen and thereby isolate a lamella. The lamella faces may be parallel or slightly tilted relative to the electron beam. FIG. 6 is an image showing an example where a specimen has been milled to isolate a lamella. The lamella can be seen projecting away from the specimen and only remaining attached by material along one edge. In this case the stage has been tilted so the lamella walls are at 10 degrees relative to the incident electron beam.

Once a lamella of the desired dimensions has been created it is then attached to the probe tip at step 110. This is achieved in the present example by bringing the probe tip into contact with an attachment point of the lamella and then using a gas injector and FIB irradiation at the attachment point such that the probe tip is welded to the edge of the lamella. The relative orientation of the probe tip and lamella is arranged specifically so that the axis of the tip is closely parallel to the side walls of the lamella. If necessary any remaining material connecting the sample to the specimen is removed by FIB milling.

Figure 7:
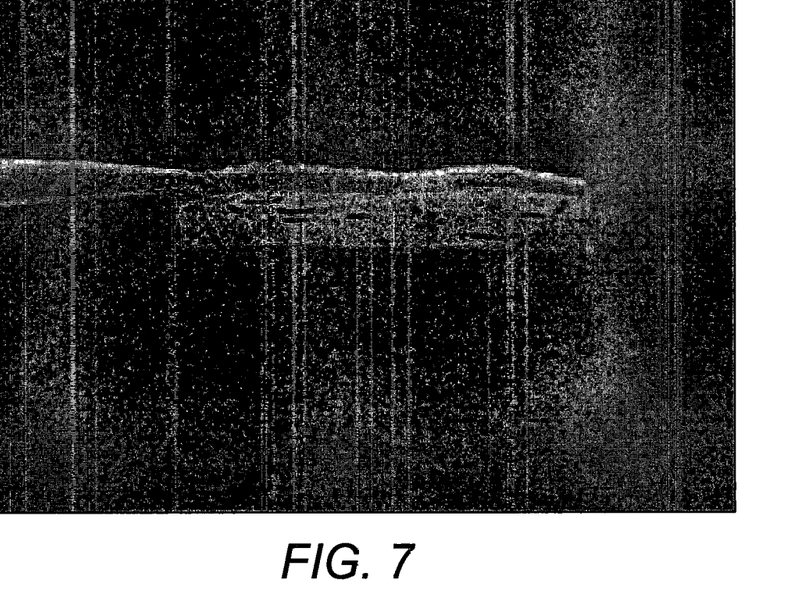
FIG. 7 is an image of the sample attached to the manipulator end effector tip.

At step 115 the stage is then lowered or the manipulator lifted to free the lamella from the bulk material. The lamella is therefore attached to the probe tip in a specific relative orientation. The lamella, attached to the probe tip and lifted clear of the specimen, is shown in FIG. 7.

Besides welding with the FIB, any attachment method known in the art for working with lift-out samples may alternatively be used to secure the sample to the end effector. These methods include use of grippers, welding using electron beam induced deposition, using an adhesive material such as glue, using force friction (by milling a small hole that serves as an insertion point for the probe needle) or using an end effector with a gap that is slightly smaller than the sample area that it engages with. For welding, a variety of precursor gases are known and preferably the precursor used will not lead to added material that will substantially affect the quality of the signal during EDS/EBSD/TKD analysis. If the end effector is a probe needle made of tungsten, use of W(CO)6 precursor produces a strong weld and is suitable for subsequent analysis of the sample.

Although the manipulator is commonly mounted on a vacuum port that can be in the chamber wall or on the chamber door, the manipulator can alternatively reside within the vacuum chamber and be fixed to the stage for example. In either arrangement the manipulator should have an end effector with a controllable rotation about an axis that can be set in a particular orientation relative to the normal to the surface of the small specimen to be analysed.

Figure 8:
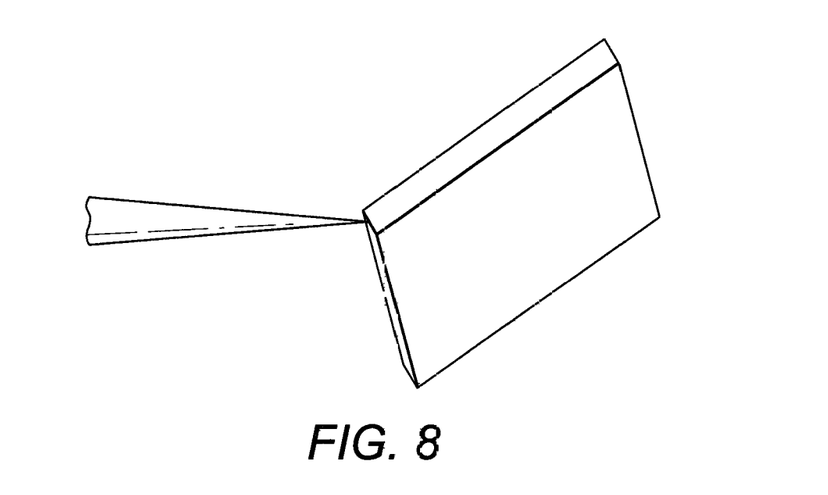
FIG. 8 shows the sample as viewed along the electron beam when in a position for FIB processing.
Figure 9:
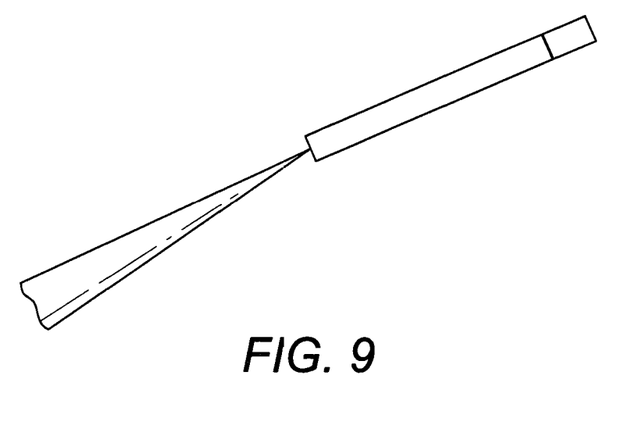
FIG. 9 shows a view from the FIB with the sample in a similar position as FIG. 8.

At step 120, the translation controls on the manipulator are used to position the lamella at the point in space that is close to the intersection of FIB and electron beams (known as the "coincident point") and the x, y, z and rotation coordinates are saved as the "Start position". At step 125, the probe needle is then rotated counter-clockwise by 49.5 degrees and the electron beam view is shown schematically in FIG. 8. As FIG. 9 shows, when viewed from the FIB beam direction the FIB beam is then close to parallel to the surface of the lamella. The x, y, z and rotation coordinates for the manipulator are saved to define the "FIB processing position". In this position, at step 130 the FIB beam (for example, 30 keV Ga+ ions, 200 pA or less current) is used to etch the sides of the lamella to make it thinner and ideally less than 100 nm in thickness. Note that this thinning step may not be necessary if the original FIB milling provides a thin enough lamella. Furthermore, if required, a well-known low-keV FIB clean-up step can also be used to remove Ga damage.

Figure 10:
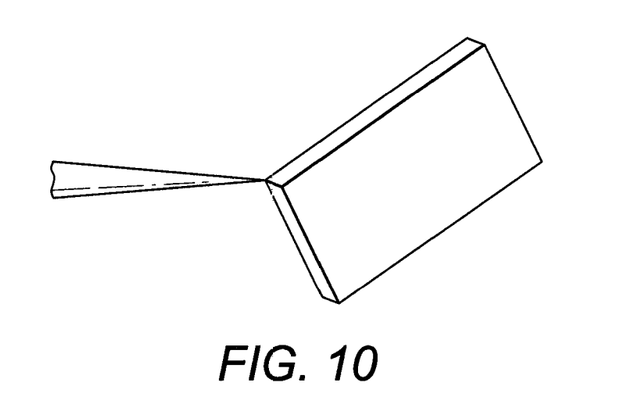
FIG. 10 shows a view of the sample along the electron beam when the sample is in a position for performing TKD.

The lamella is returned by the manipulator to the "Start position" and then the tip is rotated counter-clockwise by 65 degrees at step 135. In this position, shown in FIG. 10, the surface tilt relative to the electron beam is about 35 degrees and the EBSD camera can see the underside of the lamella. Although this tilt is greater than the 10 to 20 degrees suggested for TKD (by Geiss et al), we have found that a TKD pattern can still be acquired in this geometry and the corresponding manipulator coordinates are recorded as the "TKD position". In practice, some small adjustment of the manipulator may improve pattern quality. FIG. 10 shows the electron beam view of the lamella in the "TKD position".

In some cases it may be impossible to obtain a TKD pattern near the TKD position due to surface damage. In this case, the manipulator can be driven back to the "FIB processing position" where special conditions can be set for the FIB gun (e.g. lower keV, reduced current) and a marginal adjustment made to the tip to give a glancing angle of incidence in order to achieve a "polishing" action to remove surface damage without further damaging any crystalline layers below. After polishing the surface, the manipulator is returned to the "TKD position" to collect analytical data.

Figure 11:
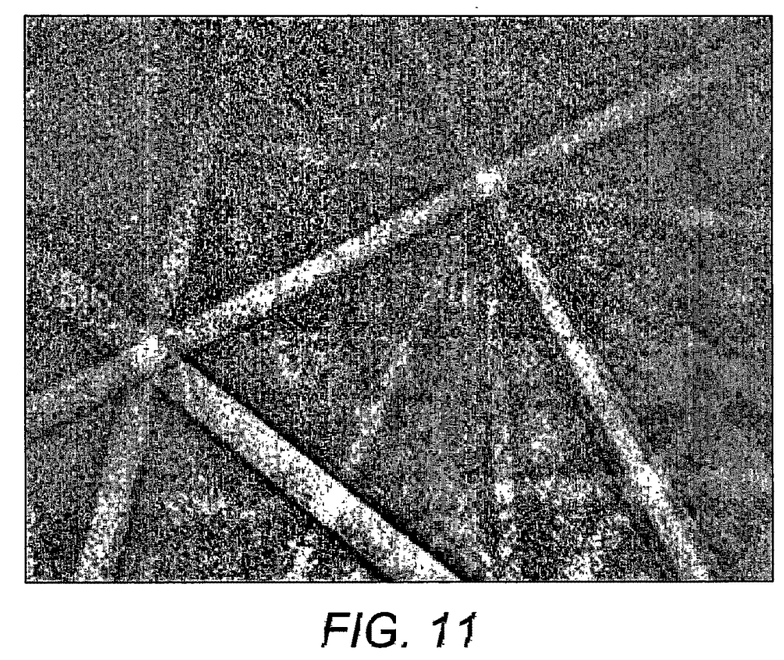
FIG. 11 shows an example TKD pattern.

At step 140, with the sample in the "TKD position" the incident electron beam is directed to one position on the surface and a TKD pattern is recorded from the EBSD camera as shown in FIG. 11.

Figure 12:
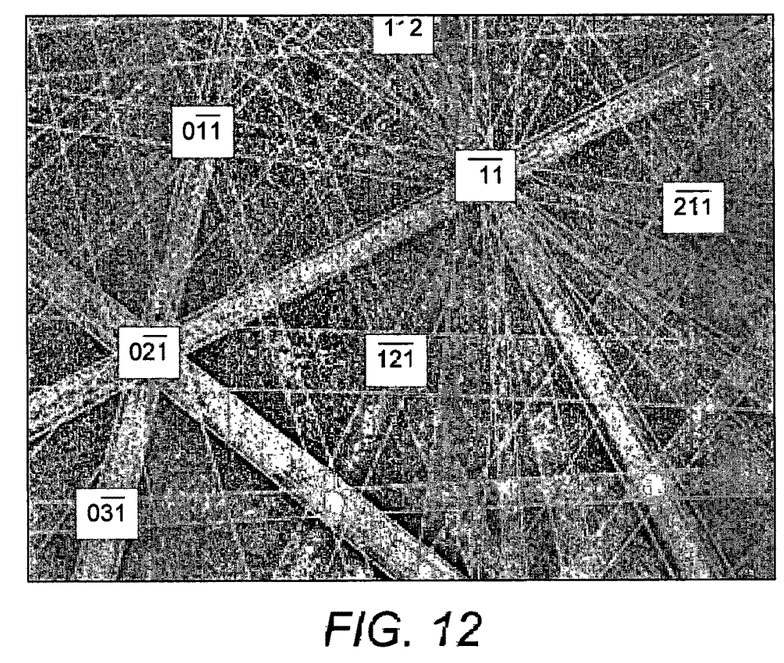
FIG. 12 shows the pattern of FIG. 11 following indexing.
Figure 13:
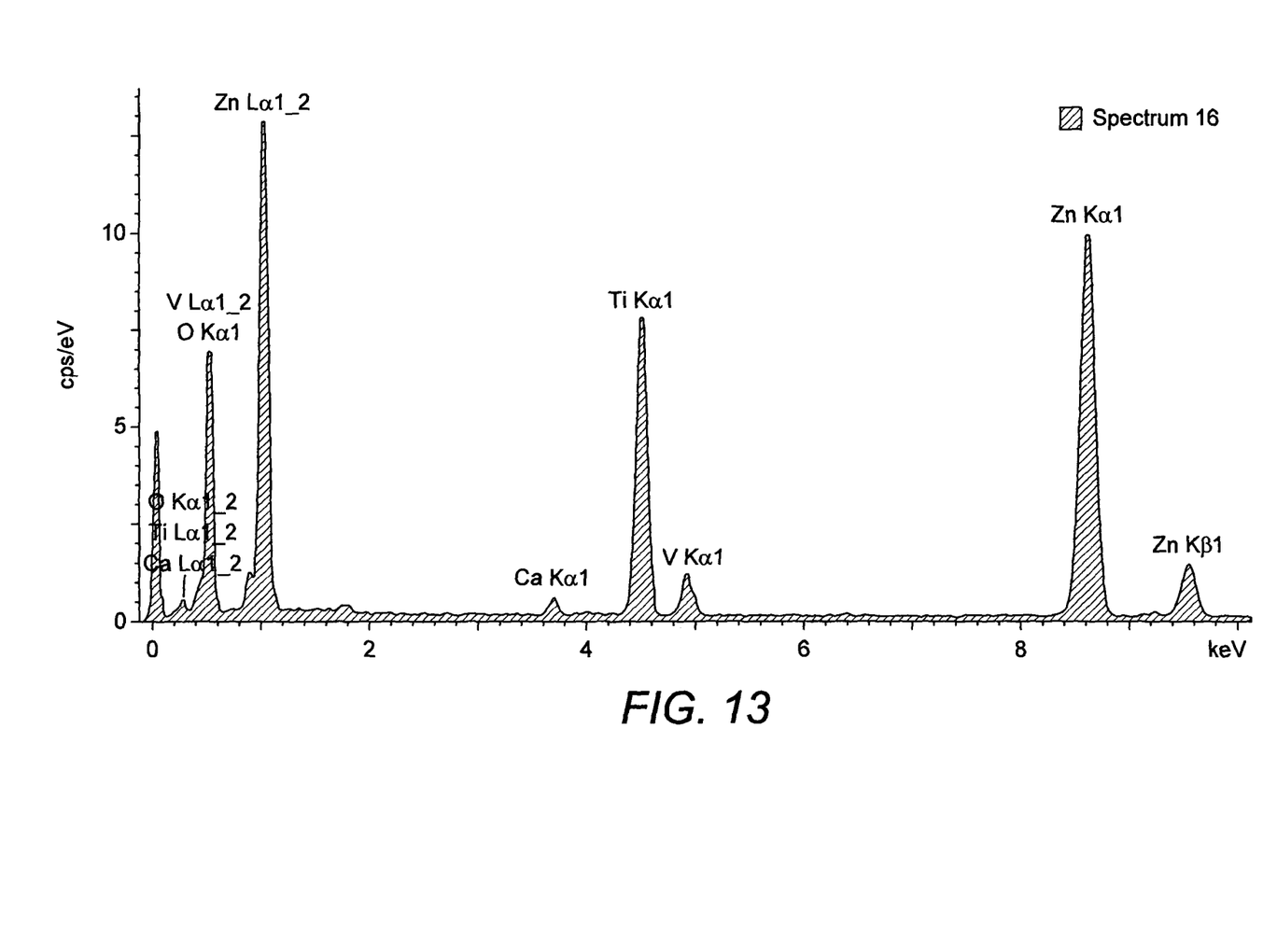
FIG. 13 shows an example X-ray spectrum obtained from a similar region of the sample.

At step 145, using typical software used for analysing EBSD patterns, the TKD pattern can be "solved" to deduce a suitable crystal structure and orientation and indices of the planes responsible for the lines in the Kikuchi pattern. FIG. 12 is a TKD pattern showing predicted lines corresponding to Bragg reflections of electrons on various planes of the crystal, in this case Spinel ICSD 4/mm (ICSD80853). While the electron beam is in the same position, an X-ray spectrum can also be recorded as shown in FIG. 13.

Analysis of the TKD pattern can often provide enough information to determine the crystalline phase of the material, particularly where there is some prior knowledge of what type of materials may be present. In more demanding cases, the chemical elements and composition deduced from the X-ray spectrum can provide additional information to resolve any ambiguities in phase determination. Thus, through either TKD or the combination of TKD and X-ray data, the phase at the electron beam position can be determined.

Figure 14:
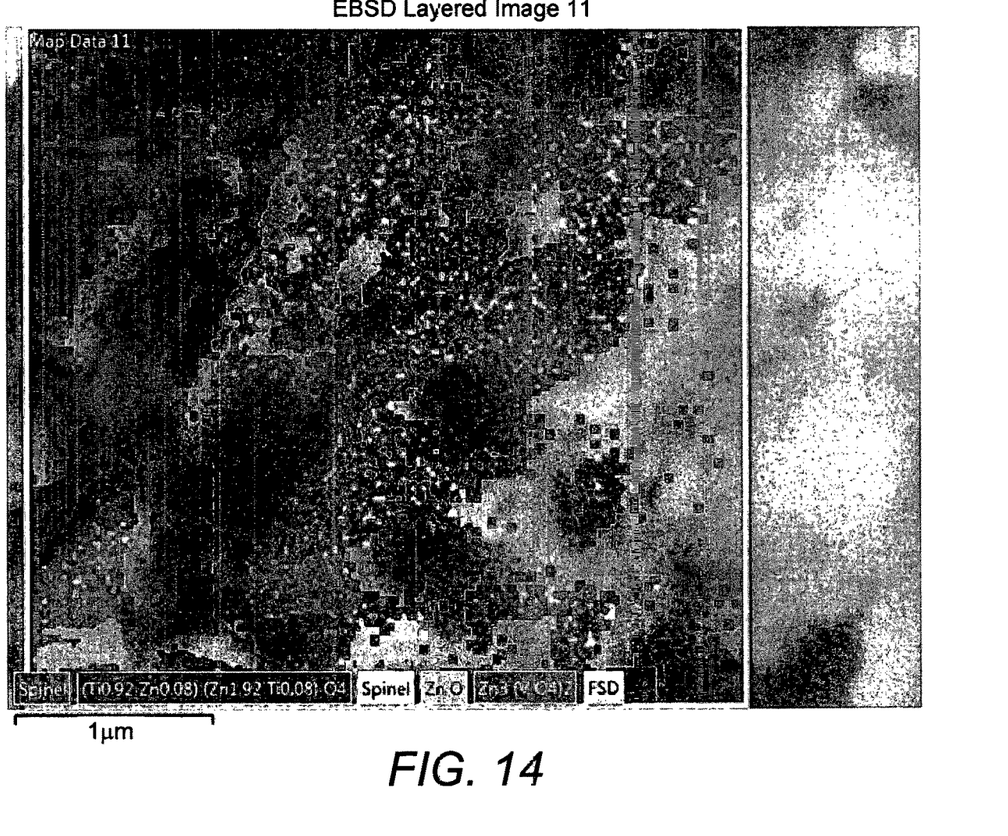
FIG. 14 illustrates a map formed from repeated analysis performed a an array of locations on the sample.

At step 150 TKD patterns and optionally X-ray data are obtained from a number of different locations on the sample. For example, if the electron beam is now directed to a series of positions covering a one dimensional line of points, or a two dimensional grid, a 1 D linescan or a 2 D map can be constructed showing compositional information at each pixel position. This is performed at step 155. FIG. 14 is an example of such a map showing the distribution of different phases, superimposed on an electron image of the same field of view.

The advantage of using a thin lamella specimen is to reduce sideways electron scattering and thus confine the excitation of X-rays and the effective source for electron diffraction to a smaller region so that it is possible to resolve differences in materials on a much finer spatial scale than with a bulk specimen. The arrangement of equipment used for the first embodiment is particularly convenient because the lamella can be held in position where it is straightforward to rotate between the "TKD position" and the "FIB processing position". In addition, if the manipulator is returned to the "Start position" and rotated clockwise by 39 degrees then the lamella is tilted by 69 degrees, making an angle of 21 degrees with the electron beam so that a conventional EBSD pattern can be collected from the top surface. In this "EBSD position", the electron scattering is accentuated by about a factor of 3 in the direction of tilt so the spatial resolving power is not as good as in the "TKD position". However, collecting camera data in the "EBSD position" can be useful to establish that the quality of the surface is suitable to obtain a diffraction pattern and if necessary prompt action to polish with the FIB. Furthermore, if speed is more important than spatial resolution, analysis in the "EBSD position" does not require any careful FIB thinning of the sample.

With a tilt in the "TKD position" of 35 degrees, the elongation of the electron scattering volume is about a factor of 1.2. An alternative embodiment can be used to achieve a geometry where there is less tilt of the lamella in the "TKD position" and the same principle can be used to achieve zero tilt. This approach requires fixing the manipulator tip at a special angle to the edge of the lamella, rather than pointing along the edge. As an example, before lift-out, the lamella is etched and oriented along the electron beam direction and the stage is tilted by 10 degrees as in FIG. 6 but the stage is then rotated counter-clockwise by 52 degrees before fixing the probe tip to the edge of the lamella. In the "Start position", the electron beam view then appears as in FIG. 15.

Figure 15:
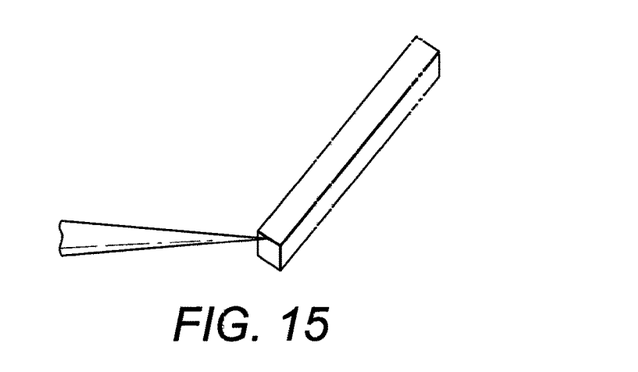
FIG. 15 is a view along the electron beam with the sample attached to the end effector at a different predetermined orientation; and, FIG. 16 is a flow diagram of an example method.

A clockwise rotation of the tip by 157 degrees brings the surface of the lamella so that it is tilted away from the camera with the normal at 20 degrees to the electron beam, one of the conditions suggested for conventional TKD. Furthermore, from the "Start position", a counter-clockwise rotation of the tip of 32 degrees brings the surface of the lamella into the right position for FIB processing. Alternatively, a clockwise rotation of 43 degrees from the "Start position" brings the lamella to a position with the surface normal at 70 degrees to the electron where it is in the correct geometry for EBSD.

It should be appreciated that the example angles described above are specific to a particular arrangement of FIB, electron column, manipulator, EBSD camera and X-ray detector. However, the same principles can be applied to other configurations. One further advantage of the current invention is that in configurations where the EBSD camera and X-ray detector are not on the same side of the chamber, or are separated by a wide angle, it is possible to collect both an TKD pattern and an X-ray spectrum simultaneously whereas this is not possible using conventional EBSD with a bulk specimen.

When a material region is below 100 nm in dimension, the combined manipulator and equipment solution must hold the sample still enough so that the electron beam continues to fall within the region for the duration of the data acquisition in order to obtain an unambiguous result. The manipulator probe is preferably made from rigid material to provide a stable support. If vibration is detected by blurring of the electron image, then a support can be provided as part of the specimen stage so that a gradual force can be applied to the side of the probe until the vibration is reduced to an acceptable level. If gradual drift is noticed, then by regular fast acquisition of an electron image, a software algorithm can be used to regularly reposition the electron beam within the desired region and thus compensate for the drift. These measures are particularly useful when obtaining a high resolution map of the sample. It may in some cases be necessary to tightly control the environment where the equipment resides so the temperature is maintained to a stability of 0.1° C. and no drafts from outside sources are allowed to fall onto the equipment.

Through the invention, it is now possible to analyse the crystalline structure of a small feature within an irregular specimen with a spatial resolution much better than 1000 nm and usually better than 100 nm. Furthermore, the procedure is efficient since the specimen is effectively prepared within the vacuum chamber rather than elsewhere. Crucially, there is no need to transfer and fix a sample of the specimen to a special grid and/or stub and it is easy to reprocess the sample by iteration to achieve an improved analytical result.

The invention claimed is:

1. A method for performing electron diffraction pattern analysis upon a sample, the method comprising performing the following steps in a vacuum chamber:
    a) isolating part of a specimen using a focused particle beam so as to form a sample;
    b) attaching a manipulator end effector to the sample so as to effect a predetermined orientation between the manipulator end effector and the sample;
    c) detaching the sample from the specimen and moving the sample clear of the specimen while the sample is fixed to the manipulator end effector at the predetermined orientation relative to the manipulator end effector;
    d) rotating the manipulator end effector about a rotation axis of the manipulator end effector to bring the sample into a predetermined geometry with respect to an electron beam and diffraction pattern imaging apparatus so as to enable an electron diffraction pattern to be obtained from the sample while the sample is still fixed to the manipulator end effector at the predetermined orientation relative to the manipulator end effector; and,
    e) causing said electron beam to impinge upon the sample attached to the manipulator end effector and obtaining said electron diffraction pattern, wherein the rotation axis of the manipulator end effector is at an angle to an electron beam axis of the electron beam of less than 90 degrees.

2. A method according to claim 1, wherein the manipulator end effector is adapted to be controlled so as to rotate it by a known angle about a known rotation axis so as to effect said rotating.

3. A method according to claim 1, wherein at least part of the sample is formed into a thin slice and wherein at least one surface of said slice has a defined orientation relative to the rotation axis.

4. A method according to claim 3 wherein, when the thin slice has two surfaces, the surfaces are generally parallel and the separation of the surfaces is sufficiently low so as to permit the transmission of an electron beam.

5. A method according to claim 1, wherein the sample is formed as a lamella having a thickness of 200 nm or less.

6. A method according to claim 1, wherein the sample is milled to a predetermined thickness either before or after the sample is detached from the specimen.

7. A method according to claim 1, wherein the electron diffraction pattern is a transmission Kikuchi diffraction (TKD) pattern recorded by a camera viewing the surface of the sample at a location where the incident electron beam emerges after passing through the sample.

8. A method according to claim 1, wherein the electron diffraction pattern is an electron backscatter diffraction pattern recorded by a camera viewing the surface of the sample at a location where the incident electron beam strikes the sample.

9. A method according to claim 1, where the manipulator is inserted into the microscope through an orifice in the vacuum chamber.

10. A method according to claim 1, wherein analysis of the electron diffraction pattern is used to determine crystalline properties of the material.

11. A method according to claim 1, where an X-ray spectrum is acquired in the same geometry and from a common overlapping region of the sample as is used to collect the electron diffraction pattern.

12. A method according to claim 11, wherein the crystalline properties of the material in conjunction with chemical elemental information from analysis of the X-ray spectrum are used to determine the phase.

13. A method according to claim 1, wherein data is collected from a series of electron beam positions on the sample to build a linescan or map showing the distribution of different materials over that range of positions.

14. A method according to claim 1 where rotation and, optionally translation, of the manipulator end effector is used to bring the specimen into the required geometry for focused ion beam (FIB) processing and then returned to the required geometry to collect the electron diffraction pattern without detaching the end effector from the specimen.

15. A method according to claim 1 wherein arrangement of the apparatus is such that rotation and, optionally translation, of the manipulator end effector is capable of bringing the specimen into every one of the different geometries required for focused ion beam (FIB) processing, electron backscatter diffraction (EBSD) and transmission Kikuchi diffraction (TKD).

16. A method according to claim 1 where translation and rotation of the manipulator end effector is used to bring the sample into the required geometry to collect an electron diffraction pattern while the sample is still fixed to the end effector.

17. A method according to claim 1, wherein the said predetermined orientation relative to the rotation axis is a predetermined orientation in accordance with the geometrical arrangement of the interior of the vacuum chamber.

18. A method according to claim 1, wherein the said focused particle beam and the collection of the electron diffraction pattern are performed in situ within the vacuum chamber.

19. A method according to claim 1, wherein the vacuum chamber is that of a focused ion beam-scanning electron microscope (FIB-SEM) instrument.

* * * * *